United States Patent
Kang et al.

(10) Patent No.: US 9,519,222 B2
(45) Date of Patent: Dec. 13, 2016

(54) DYNAMIC OPTICAL HEAD LAYER AND LITHOGRAPHY METHOD USING THE SAME

(71) Applicant: INDUSTRY-ACADEMIC COOPERATION FOUNDATION YONSEI UNIVERSITY, Seoul (KR)

(72) Inventors: Shinill Kang, Seoul (KR); Jungjin Han, Seoul (KR); Eikhyun Cho, Seoul (KR); Younggeol Cho, Seoul (KR); Se-Young Choi, Goyang-si (KR)

(73) Assignee: INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 46 days.

(21) Appl. No.: 14/635,336

(22) Filed: Mar. 2, 2015

(65) Prior Publication Data

US 2015/0248061 A1      Sep. 3, 2015

(30) Foreign Application Priority Data

Feb. 28, 2014   (KR) .................. 10-2014-0024589

(51) Int. Cl.
  *G03F 7/20*        (2006.01)
(52) U.S. Cl.
  CPC ................... *G03F 7/7015* (2013.01)
(58) Field of Classification Search
  CPC ................................................... G03F 7/7015
  See application file for complete search history.

(56) References Cited

U.S. PATENT DOCUMENTS

| | | | | |
|---|---|---|---|---|
| 6,660,451 B1* | 12/2003 | Sakaue | ............. | G11B 7/00454 |
| | | | | 369/275.2 |
| 2002/0105628 A1* | 8/2002 | Saito | ................. | G03F 7/70325 |
| | | | | 355/69 |
| 2004/0246457 A1* | 12/2004 | Okazaki | ................ | G03B 27/54 |
| | | | | 355/67 |

(Continued)

FOREIGN PATENT DOCUMENTS

| | | |
|---|---|---|
| JP | 60-155495 A | 8/1985 |
| JP | 04-119883 A | 4/1992 |

(Continued)

OTHER PUBLICATIONS

JPO Office Action for Japanese Application No. 2015-40796 which corresponds to the above-referenced U.S. appllication.

(Continued)

*Primary Examiner* — Steven H Whitesell Gordon
(74) *Attorney, Agent, or Firm* — LRK Patent Law Firm (57) ABSTRACT

The present invention relates to a dynamic optical head layer in an optical lithography system forming patterns on a substrate, the dynamic optical head layer being detachably mounted on the substrate, and the dynamic optical head layer includes a first dielectric layer formed on a top portion thereof, a second dielectric layer formed on a bottom portion thereof, and an dynamic nano aperture layer formed between the first dielectric layer and the second dielectric layer, wherein the dynamic nano aperture layer is made of a material having optical anisotropy, and the first dielectric layer and the second dielectric layer are made of oxide-based materials, nitride-based materials, and carbide-based materials.

13 Claims, 10 Drawing Sheets

(56) References Cited

U.S. PATENT DOCUMENTS

2013/0094009 A1\* 4/2013 Lafarre .................. G03F 7/707
355/72

FOREIGN PATENT DOCUMENTS

| JP | 11-271960 A | 8/1999 |
| JP | 2001-057329 A | 2/2001 |
| JP | 2001-066783 A | 3/2001 |
| JP | 2002-222755 A | 8/2002 |
| JP | 2003-323748 A | 11/2003 |
| JP | 2005-019982 A | 1/2005 |
| JP | 2009-147334 A | 7/2009 |
| KR | 10-2005-0055075 A | 6/2005 |
| KR | 10-0687750 B1 | 2/2007 |
| KR | 10-2010-0065769 A | 6/2010 |
| KR | 10-2011-0025499 A | 3/2011 |

OTHER PUBLICATIONS

KIPO Office Action for Korean Patent Application No. 10-2014-0024589 which corresponds to the above-identified U.S. application.

\* cited by examiner

| Thickness ZnS-SiO$_2$ (Top) / Sb$_{65}$Se$_{35}$ | 10 nm | 15 nm | 30 nm |
|---|---|---|---|
| 140 nm | 0.1727·0.2091·0.1727 | 0.1364·0.1727·0.1545 | 0.0273·0.1364·0.1 |
| 170 nm | 0.1545·0.1909·0.1727 | 0.1182·0.1729·0.1545 | 0.0273·0.1545·0.0818 |
| 200 nm | 0.1727·0.1909·0.1909 | 0.1364·0.1909·0.1364 | 0.0636·0.1364·0.0636 |

FIG. 10

DYNAMIC OPTICAL HEAD LAYER AND LITHOGRAPHY METHOD USING THE SAME

BACKGROUND OF THE INVENTION

Field of the Invention

The present invention relates to a dynamic optical head layer (an optical head with a layer for formation of dynamic nano apertures) ("a dynamic optical head layer" hereinafter) and a lithography method using the same, and more particularly, to a dynamic optical head layer that has upper and lower dielectric layers and an dynamic nano aperture layer (a layer for formation of dynamic optical nano apertures) ("an dynamic nano aperture layer" hereinafter) located at an intermediate layer thereof and a near-field optical lithography method using the same.

Background of the Related Art

With the advancement of information age, the performance and conveniences of various electronic equipment, such as displays, computers, and solar cells have been improved every day to make daily lives of people more convenient, and therefore, many studies on the miniaturization and high-density integration of electronic components have been dynamically made. The most important role in the high integration of the electronic components is a printing technology, and hundreds of processes are conducted in semiconductor manufacturing. In this case, the printing process needing 60% of time for the whole production processes becomes very important technology. Generally, the printing process is classified into contact printing, proximity printing, and projection printing, and the contact printing and the proximity printing using a photomask are widely used in the electronic components production process. In case of the printing using the photomask, however, a high-priced mask for each model should be designed and manufactured, and after making the mask, the maintenance costs are generated, thus making it hard to perform small quantity batch production. Further, the printing is conducted by using laser beams passed through the projection printing so as to form high-precision patterns, and at this time, high-priced low-wavelength light source and high magnification optical system should be required. A maskless lithography technology in the projection printing is a method for making an arbitrary shape, without having any photomask, thus making it possible to perform small quantity batch production in a very economical way. However, the resolution limit (diffraction limit) of light exists due to the wavelength of light source and the numerical apertures of the lens, thus causing the limitation in manufacturing high-precision patterns. So as to overcome the diffraction limit, various process technologies, such as EUV (extreme ultraviolet), nanoimprinting lithography, e-beam lithography, focused ion beam lithography, scanning probe lithography, SIL-based lithography, plasmonic lithography, and so on, have been proposed, but super precision gap control and high process cost and long process time due to low scanning speed and transmittance efficiency still remain as problems to be solved.

Figure 1A:
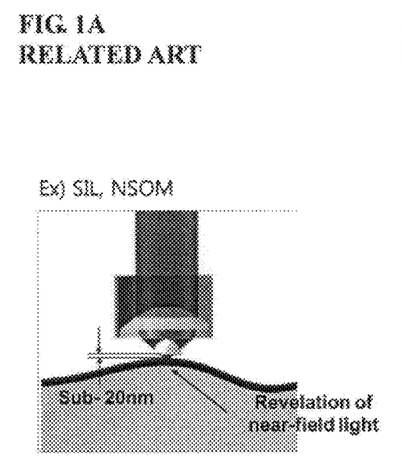
FIG. 1A shows a single probe-based nano lithography system and FIG. 1B shows a multi probe-based nano lithography system.
Figure 1B:
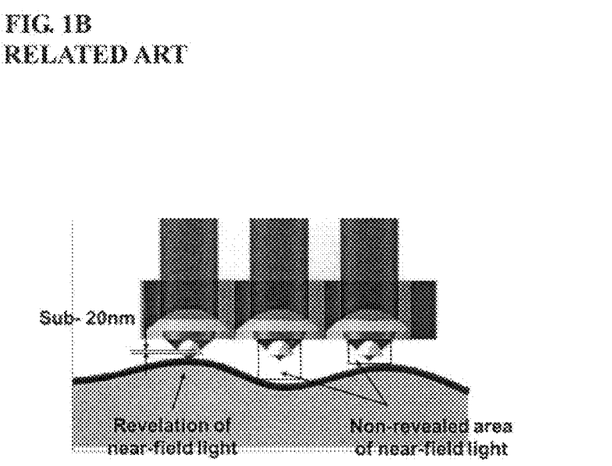

FIGS. 1A and 1B are sectional views showing conventional nano lithography systems, wherein FIG. 1A shows a single probe-based nano lithography system and FIG. 1B shows a multi probe-based nano lithography system.

The existing maskless nano lithography technology generally conducts patterning on the basis of a single near-field probe, thus making it hard to achieve large area patterning. So as to overcome the problem, accordingly, a parallel near-field patterning system using multiple near-field probes has been recently proposed, but since the near-field patterning system should need maintaining uniform gaps (tens of nanometers) from a sample, it is impossible to conduct patterning, while maintaining the uniform gaps over a large area.

SUMMARY OF THE INVENTION

Accordingly, the present invention has been made in view of the above-mentioned problems occurring in the prior art, and it is an object of the present invention to provide a dynamic optical head layer and a lithography method using the same wherein an dynamic nano aperture layer is made of a material having optical anisotropy, desirably, $Sb_{65}Se_{35}$ to allow an optical nano aperture formation temperature to be lowered, thus making it possible to conduct large area patterning using a microlens array with low energy light source and reducing light/heat spreading through rapid response speed to achieve the formation of nanopatterns.

It is another object of the present invention to provide a dynamic optical head layer and a lithography method using the same wherein scanning type patterning in the unit of mm/s is conducted, thus making it possible to conduct large area patterning in the scanning way using X and Y stages and being applicable to the fields in which various electronic components like displays, semiconductors and so on are manufactured.

It is yet another object of the present invention to provide a dynamic optical head layer and a lithography method using the same wherein a substrate layer is made of a soft elastic material, so that the dynamic optical head layer can be easily coupled to various shaped substrates, e.g., a curved substrate.

To accomplish the above-mentioned objects, according to a first aspect of the present invention, there is provided a dynamic optical head layer in an optical lithography system forming patterns on a substrate, the dynamic optical head layer being detachably mounted on the substrate, the dynamic optical head layer including: a first dielectric layer formed on a top portion thereof; a second dielectric layer formed on a bottom portion thereof; and an dynamic nano aperture layer formed between the first dielectric layer and the second dielectric layer, wherein the dynamic nano aperture layer is made of a material having optical anisotropy.

According to the present invention, desirably, the material having optical anisotropy is $Sb_{65}Se_{35}$.

According to the present invention, desirably, the first dielectric layer 110 and the second dielectric layer 130 are made of oxide-based materials, nitride-based materials, and carbide-based materials.

According to the present invention, desirably, the oxide-based materials include $SiO_2$, $ZnS$—$SiO_2$, $GeO_2$, $BeO_2$, $ZrO_2$, $BaTiO_3$, $SrTiO_3$, and $TaO$.

According to the present invention, desirably, the nitride-based materials include $SiN_4$, $BN$, and $AlN$.

According to the present invention, desirably, the carbide-based materials include $SiC$.

According to the present invention, desirably, the first dielectric layer and the second dielectric layer are made of $ZnS$—$SiO_2$.

According to the present invention, desirably, the dynamic optical head layer further includes a substrate layer located on the top of the first dielectric layer to support the laminated structure of the first dielectric layer, the dynamic nano aperture layer, and the second dielectric layer.

According to the present invention, desirably, if the deposited surface of the substrate layer is curved, the substrate layer is made of a soft elastic material, and if the deposited surface thereof is flat, the substrate layer is made of a material like hard glass.

According to the present invention, desirably, the substrate layer includes any one of films, such as PC, COP, PI, PET, OPP, PE, PP, PMMA, and acrylic films, and glass, such as sodalime glass, borosilicate glass, fused silica glass, and quartz glass.

According to the present invention, desirably, the dynamic optical head layer further includes a hydrophobic coating layer applied to the underside surface of the second dielectric layer to allow the second dielectric layer to be easily detached from a photoresist.

According to the present invention, desirably, the hydrophobic coating layer is formed by using a self-assembled oligomer of PDMS or by depositing a self-assembled monolayer.

According to the present invention, desirably, the self-assembled monolayer includes a silane or thiol-based self-assembled monolayer.

According to the present invention, desirably, the first dielectric layer has a thickness in the range of 30 to 500 nm, the dynamic nano aperture layer has a thickness in the range of 5 to 30 nm, and the second dielectric layer has a thickness in the range of 5 to 60 nm.

According to the present invention, desirably, the films have a thickness in the range of 5 to 300 nm.

To accomplish the above-mentioned objects, according to a second aspect of the present invention, there is provided a lithography method using a dynamic optical head layer including: the substrate preparation step of placing a substrate on a stage; the photoresist coating step of coating a photoresist onto the substrate; the dynamic optical head layer coupling step of coupling the dynamic optical head layer to the photoresist; the pattern formation step of irradiating laser beams, moving the stage, and forming patterns on the substrate; and the super resolution separation step of separating the dynamic optical head layer from the photoresist, wherein the dynamic optical head layer includes a first dielectric layer formed on a top portion thereof, a second dielectric layer formed on a bottom portion thereof, and an dynamic nano aperture layer formed between the first dielectric layer and the second dielectric layer, the dynamic nano aperture layer being made of a material having optical anisotropy, and the first dielectric layer and the second dielectric layer being made of oxide-based materials, nitride-based materials, and carbide-based materials, and if the laser beams are irradiated in the pattern formation step, dynamic optical nano apertures are formed on the dynamic nano aperture layer to allow the laser beams to be transmitted therethrough to form patterns on the substrate.

According to the present invention, desirably, in the pattern formation step the patterns are formed in such a way that the laser beams are incident through modulation and the incident laser beams are focused through a microlens array 300 and or in such a maskless way using a DMD (digital micro mirror device).

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 1A and 1B are sectional views showing conventional nano lithography systems, wherein

FIGS. 2A to 2C are sectional views showing a lithography system using a dynamic optical head layer according to the present invention, wherein

FIGS. 5A and 5B are graphs showing the testing results of the properties of $Sb_{65}Se_{35}$, wherein

DETAILED DESCRIPTION OF THE PREFERRED EMBODIMENTS

Hereinafter, an explanation on a dynamic optical head layer and a lithography method using the same according to the present invention will be in detail given with reference to the attached drawing.

Figures 2A, 2B:
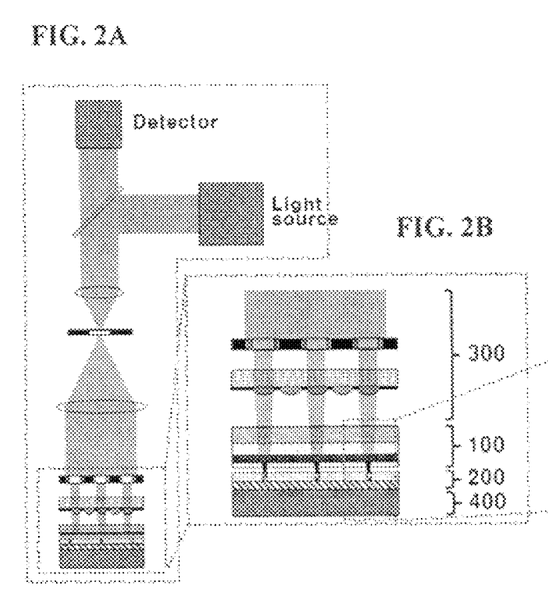
FIG. 2A shows the configuration of the entire system.
FIG. 2B is an enlarged view of a multi parallel beam array, the dynamic optical head layer and a pattern part.
Figure 2C:
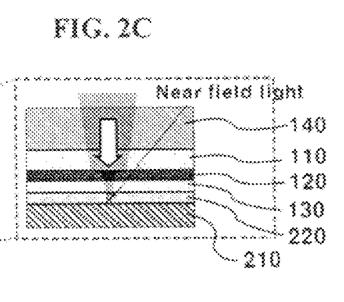
FIG. 2C is an enlarged view of the dynamic optical head layer coupled to a substrate.

FIGS. 2A to 2C are sectional views showing a lithography system using a dynamic optical head layer according to the present invention, wherein FIG. 2A shows the configuration of the entire system, FIG. 2B is an enlarged view of a multi parallel beam array, the dynamic optical head layer and a patterning portion, and FIG. 2C is an enlarged view of the dynamic optical head layer coupled to a substrate.

Referring to FIGS. 2A to 2C, a dynamic optical head layer 100 includes a first dielectric layer 110 formed on a top portion thereof, a second dielectric layer 130 formed on a bottom portion thereof, and an dynamic nano aperture layer 120 formed between the first dielectric layer 110 and the second dielectric layer 130.

According to the structure of the dynamic optical head layer 100, the light collected from microlenses is transmitted through the dynamic nano aperture layer 120 surrounded with the first dielectric layer 110 and the second dielectric layer 130, and accordingly, the focused region of the light is reduced. At this time, the first dielectric layer 110 and the second dielectric layer 130 serve to prevent the generation of degradation and mixing caused by the inter-diffusion among the dynamic nano aperture layer 120, a photosensitive polymer, and a substrate 210, and the second dielectric layer 130 serves as an air gap in an SIL (solid immersion lens) lithography to maintain a given distance between the dynamic optical head layer 100 and the photosensitive polymer (pattern part), thus allowing nanopatterns to be made precisely.

The first dielectric layer 110 and the second dielectric layer 130 are made of oxide-based materials, nitride-based materials, and carbide-based materials, wherein the oxide-based materials include $SiO_2$, $ZnS$—$SiO_2$, $GeO_2$, $BeO_2$, $ZrO_2$, $BaTiO_3$, $SrTiO_3$, and TaO, and the nitride-based materials include $SiN_4$, BN, and AlN. Further, the carbide-based materials include SiC and the like. Among the materials, the $ZnS$—$SiO_2$ maintains a high temperature and a high mechanical strength, while having a low degree of thermal deformation, thus being used most appropriately as the first dielectric layer 110 and the second dielectric layer 130.

A substrate layer 140 is located on the top of the first dielectric layer 110 to support the laminated structure of the first dielectric layer 110, the dynamic nano aperture layer 120, and the second dielectric layer 130. If the deposited surface of the substrate layer 140 is curved, the substrate layer 140 is made of a soft elastic material, and if the deposited surface thereof is flat, the substrate layer 140 is made of a soft elastic material as well as a material like hard glass. The substrate layer 140 includes any one of films, such as PC, COP, PI, PET, OPP, PE, PP, PMMA, and acrylic films, and glass, such as sodalime glass, borosilicate glass, fused silica glass, and quartz glass. According to the present invention, the dynamic optical head layer 100 is detachably mounted on the substrate 210, and so as to prevent the dynamic optical head layer 100 or the substrate 210 from being damaged during the detaching process after the mounting, accordingly, a hydrophobic coating layer 150 is coated onto the underside surface of the second dielectric layer 130.

So as to easily separate a thin film, generally, the thin film is coated by using a mold release agent. Various materials as the mold release agent, such as Teflon, diamond and the like exist, but a material having high transmittance and a low thickness is needed for the control in near-field light. Since Teflon or diamond coating is performed to a relatively high thickness, when it is coated onto the near-field optical dynamic optical head layer 100, it is hard to transmit light through the coating layer. In case of a self-assembled monolayer, oxygen gas is generated during the deposition of the self-assembled monolayer to cause the dynamic optical head layer 100 to be damaged. So as to solve the above-mentioned problems, accordingly, the hydrophobic coating layer 150 is formed by using a self-assembled oligomer of PDMS (polydimethylsiloxane), and otherwise, it is formed by depositing a self-assembled monolayer in case of an acid resistant material. The self-assembled monolayer includes a silane or thiol-based self-assembled monolayer.

Since the PDMS has good mold releasing properties, especially, it is adequate for the hydrophobic coating layer 150. In case of PDMS transfer, the layer is stably made to a height of 10 nm or less, and the material has high transparency to allow transmission loss to be small. Further, when compared with other anti-adhesion (silane self-assembled monolayer) materials, strong [Si—O—Si] n main chain bonding is conducted, which is different from carbon-based [C—C—C] n main chain bonding, thus exhibiting low variations in the surface energy values on high temperature and light.

Figure 3A:
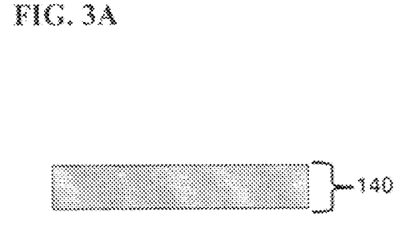
FIGS. 3A to 3D are sectional views showing a method for manufacturing a dynamic optical head layer according to the present invention.
Figure 3B:
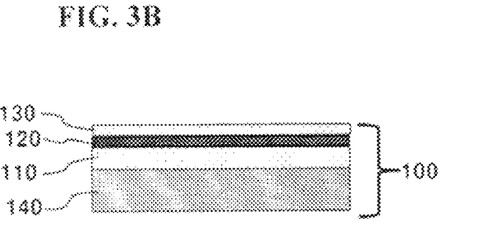
Figure 3C:
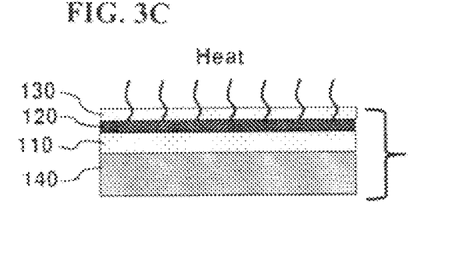
Figure 3D:
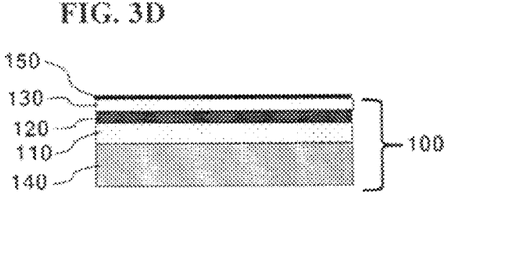

FIGS. 3A to 3D are sectional views showing a method for manufacturing a dynamic optical head layer according to the present invention. Referring to FIGS. 3A to 3D, the substrate layer 140 is first prepared as shown in FIG. 3A, and the first dielectric layer 110, the dynamic nano aperture layer 120, and the second dielectric layer 130 are deposited as shown in FIG. 3B. After that, as shown in FIG. 3C, they are appropriately heated, thus removing the influences caused by the thermal history remaining in the internal structure of the materials and their processing, and at the same time, they are annealed for the initialization to an optically non-transparent phase. That is, they are heated to a given temperature and next slowly cooled. After that, as shown in FIG. 3D, the hydrophobic coating layer 150 is coated on the second dielectric layer 130, thus completing the formation of the dynamic optical head layer 100.

Figure 4:
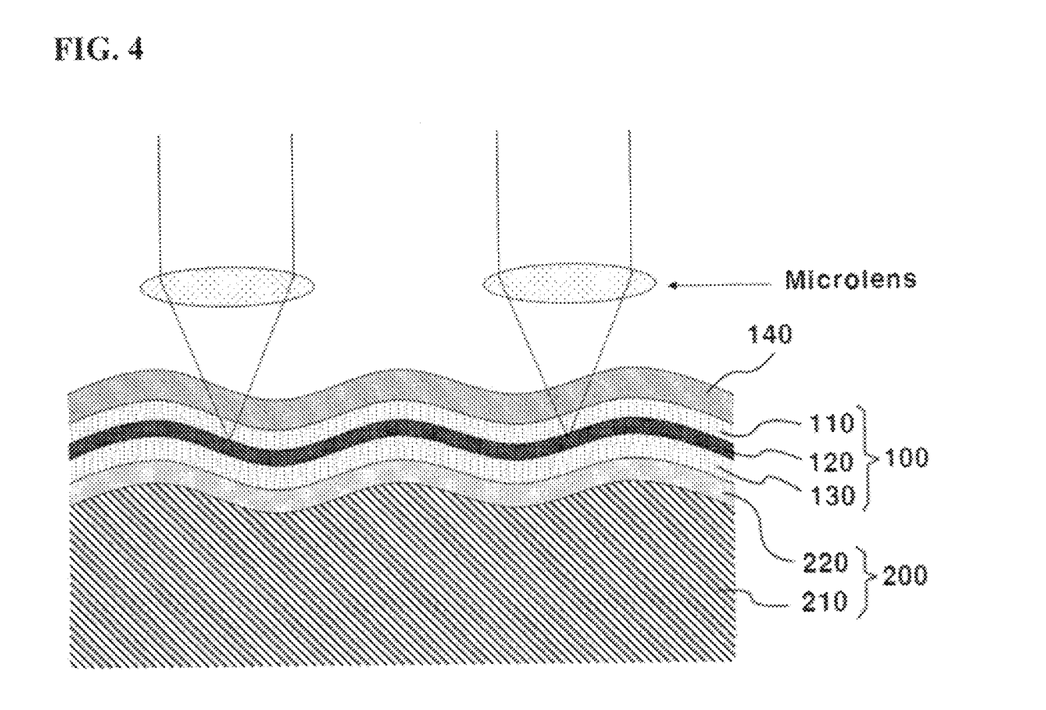
FIG. 4 is a sectional view showing the dynamic optical head layer according to the present invention coupled to a curved substrate.

FIG. 4 is a sectional view showing the dynamic optical head layer according to the present invention coupled to a curved substrate. According to the present invention, the dynamic optical head layer 100 is configured wherein a thin film is deposited on the substrate layer 140 made of a soft elastic material, so that the dynamic optical head layer 100 can be easily coupled even to the curved substrate 210 as shown in FIG. 4.

According to the present invention, the dynamic nano aperture layer 120 is made of a material having optical anisotropy, desirably, $Sb_{65}Se_{35}$.

Figure 5A:
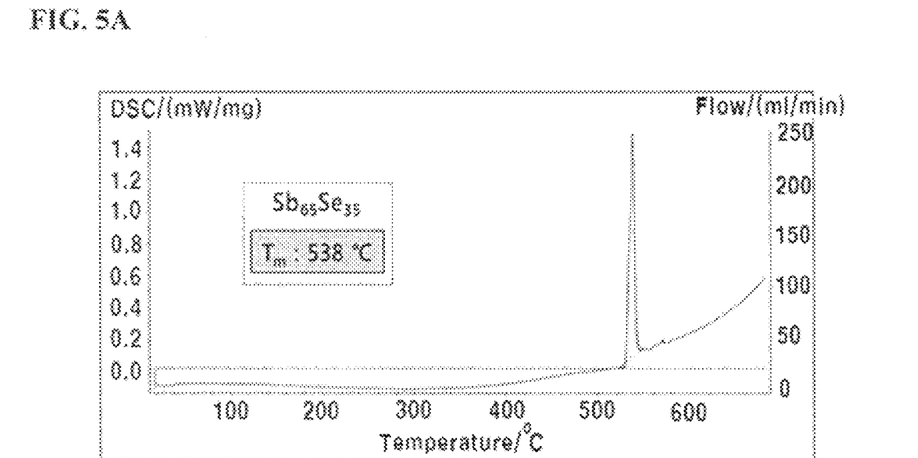
FIG. 5A shows the result of thermal analysis of a target using DSC (Differential Scanning calorimetry), and the left graph of FIG. 5B shows the measurement results of optical coefficients (n, k) according to temperature changes using an ellipsometer, while the right graph of FIG. 5B showing the measurement results of optical coefficients (n, k) according to the whole wavelengths of light.
Figure 5B:
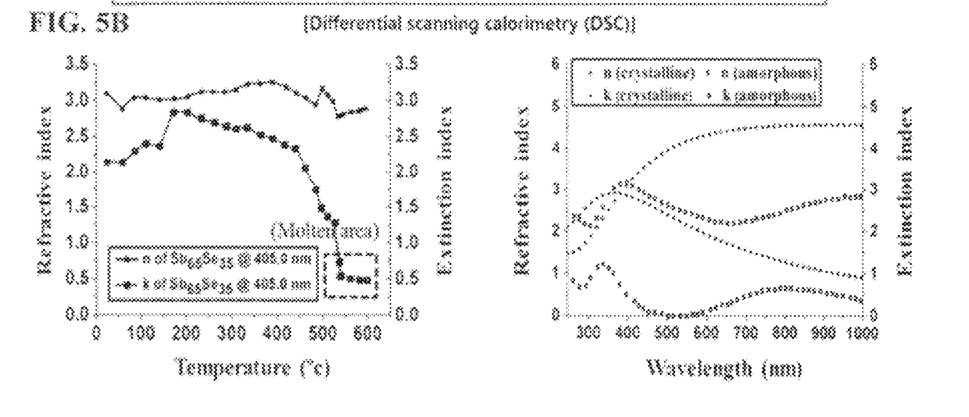

FIGS. 5A and 5B are graphs showing the testing results of the properties of $Sb_{65}Se_{35}$, wherein FIG. 5A shows the result of thermal analysis of a target using DSC (Differential Scanning Calorimetry), and the left graph of FIG. 5B shows the measurement results of optical coefficients (n, k) according to temperature changes using an ellipsometer, while the right graph of FIG. 5B showing the measurement results of optical coefficients (n, k) according to the whole wavelengths of light.

Referring to FIG. 5A, it is checked that $Sb_{65}Se_{35}$ having optical anisotropy has a low value of 538° C., so that the optical nano apertures of the dynamic optical head layer 100 can be formed through the low energy light source caused by a low melting point.

The DSC heats a sample at a constant speed and observes the variations of calories according to the change from an optically non-transparent phase to an optically transparent phase. Through the DSC, Tg, Tc, and Tm of the material are observed. A peak value in the graph of FIG. 5A becomes a point of Tg of a material. That is, when heat is applied to the dynamic nano aperture layer 120, the change from the optically non-transparent phase to the optically transparent phase or molten state is made at the point of Tg or more, thus decreasing absorption coefficient of light and increasing light transmittance.

The left graph of FIG. 5B shows the measurement results of optical coefficients (n, k) according to temperature changes using an ellipsometer. In this graph, it is checked that the value k is decreased at Tg or more, so that the light transmittance of the dynamic optical head layer 100 is increased. Through the graph, particularly, the increment of the light transmittance of the dynamic optical head layer 100 can be checked on a laser light source having a wavelength of 405 nm.

The right graph of FIG. 5B shows the measurement results of optical coefficients (n, k) according to the whole wavelengths of light. Through the graph, there are differences between the values n and k from an ultraviolet ray area to a visible ray area, so that various laser sources can be used.

Referring to the thickness of the dynamic optical head layer 100 according to the present invention, the first dielectric layer 110, which helps the formation of the dynamic optical nano apertures, has a thickness in the range of 30 to 500 nm. If the dynamic nano aperture layer 120 is thick to cause the light transmittance to be low upon printing, the substrate 210 is not printed, and therefore, the dynamic nano aperture layer 120 has a thickness in the range of 5 to 30 nm.

Further, the second dielectric layer 130, which helps a protecting layer and the dynamic nano aperture layer 120 form the dynamic optical nano apertures, requires a low thickness for the revelation of near-field, and accordingly, the second dielectric layer 130 has a thickness in the range of 5 to 60 nm.

Further, since the films require a thickness having given elasticity for bonding to a curved or flat surface, it has a thickness in the range of 5 to 300 nm, and only if the glass has an optical focal length allowed, it does not have any limitation in thickness.

Figure 6A:
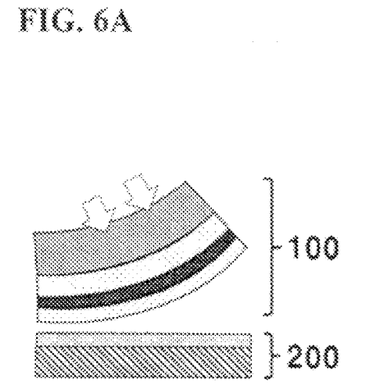
FIGS. 6A to 6D are sectional views showing a lithography method using a dynamic optical head layer according to the present invention.
Figure 6B:
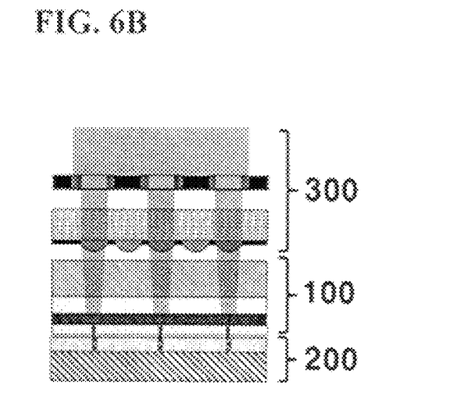
Figure 6C:
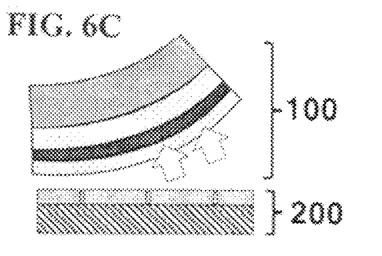
Figure 6D:
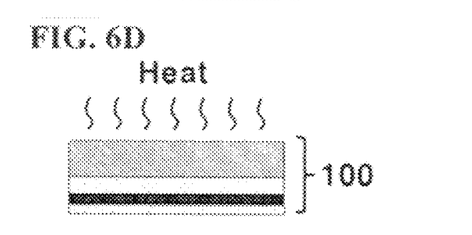

FIGS. 6A to 6D are sectional views showing a lithography method using a dynamic optical head layer according to the present invention. A lithography method using the dynamic optical head layer 100 according to the present invention includes the steps of placing the substrate 210 on a stage 400, depositing a photoresist 220 on the substrate 210, and coupling the dynamic optical head layer 100 to the photoresist 220 by means of vacuum assembling, as shown in FIG. 6A; irradiating laser beams to the dynamic optical head layer 100 to form patterns on the substrate 210 through a multiple parallel beam array, as shown in FIG. 6B; separating the dynamic optical head layer 100 from the photoresist 220, as shown in FIG. 6B; and reusing the dynamic optical head layer 100 by means of annealing, as shown in FIG. 6D.

Figure 7A:
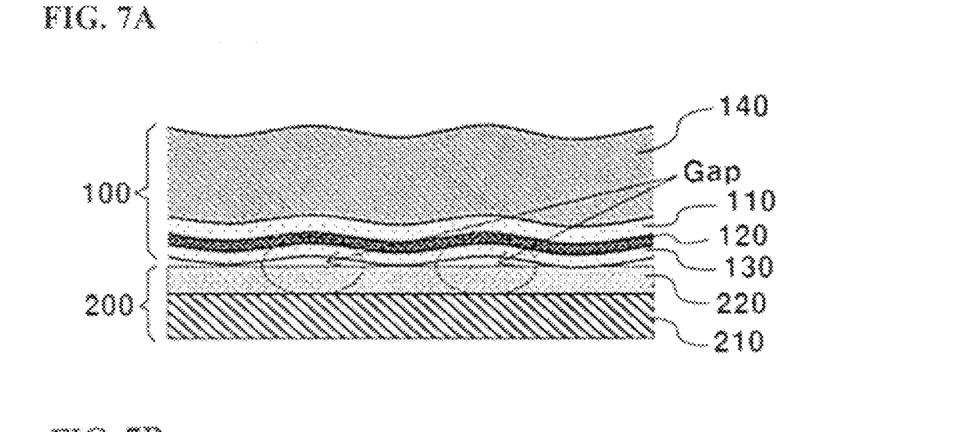
FIGS. 7A and 7B are sectional views showing the vacuum assembly of the supper resolution film to a patterning substrate.
Figure 7B:
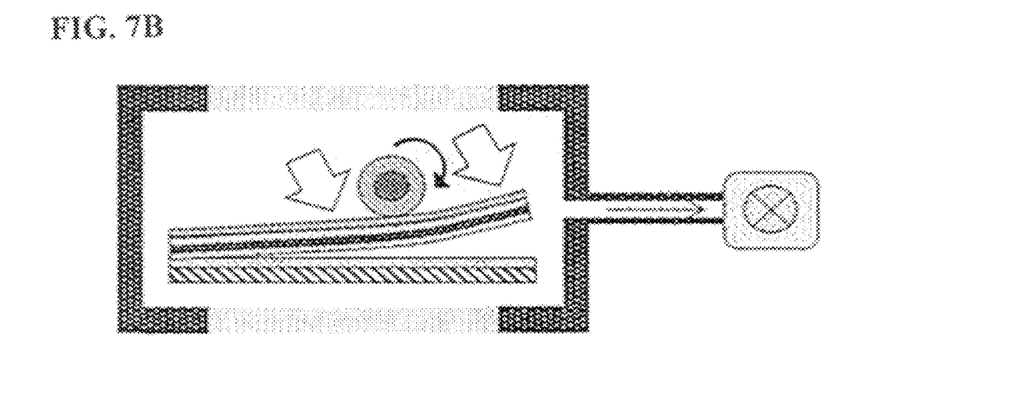

FIGS. 7A and 7B are sectional views showing the vacuum assembly of the supper resolution film to a pattern substrate. Gaps exist between the dynamic optical head layer 100 and the substrate 210, as shown in FIG. 7A, and accordingly, vacuum assembling is conducted to prevent the generation of the gaps. At this time, the dynamic optical head layer 100 is rolled and bonded in a vacuum state to the substrate 210 in such a manner as to be brought into uniform contact with the substrate 210, as shown in FIG. 7B.

Figure 8:
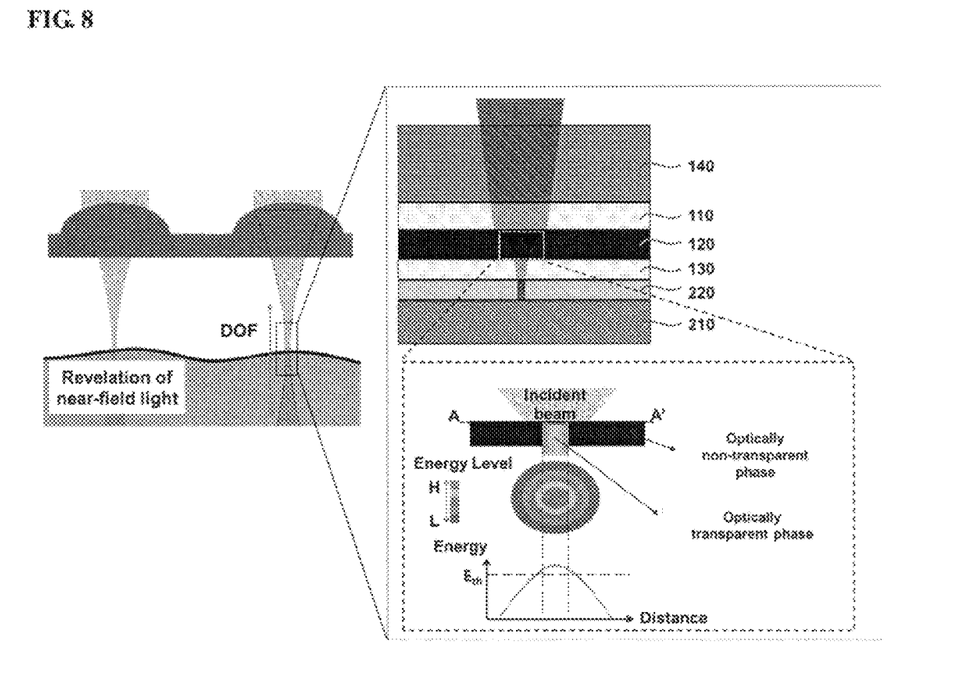
FIG. 8 is a sectional view showing the principle for forming dynamic optical nano apertures on the dynamic nano aperture layer of the dynamic optical head layer.

FIG. 8 is a sectional view showing the Principle for forming dynamic optical nano apertures on the dynamic nano aperture layer of the dynamic optical head layer.

In case where the light sources collected through microlenses 310 are irradiated to the dynamic nano aperture layer 120, the change from the optically non-transparent phase to the optically transparent phase or molten state is made at the region having specific energy $E_{th}$ in the interior of the dynamic nano aperture layer 120, thus forming the dynamic optical nano apertures. Accordingly, the beams collected at arbitrary areas are irradiated to form the dynamic optical nano apertures at desired positions. In this case, the light sources form the dynamic optical nano apertures and at the same time form the near-field according to the advancement to the interiors of the apertures, thus making nano-scale patterns. After the formation of the apertures, further, the annealing is conducted to return the physical properties of the dynamic nano aperture layer 120 from a second state to a first state.

Figure 9A:
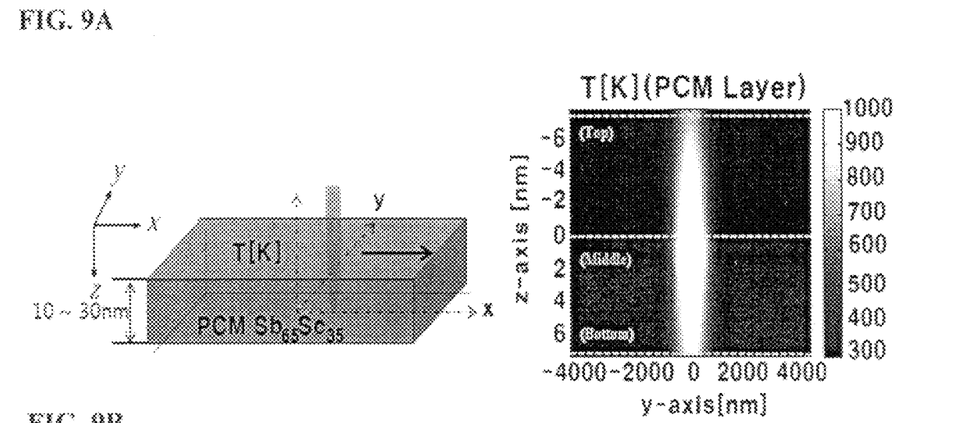
FIGS. 9A and 9B are views showing the simulation results of the sizes of the dynamic optical nano apertures on the dynamic nano aperture layer in accordance with the variations of the thicknesses of the dynamic nano aperture layer and the first dielectric layer of the dynamic optical head layer.
Figure 9B:
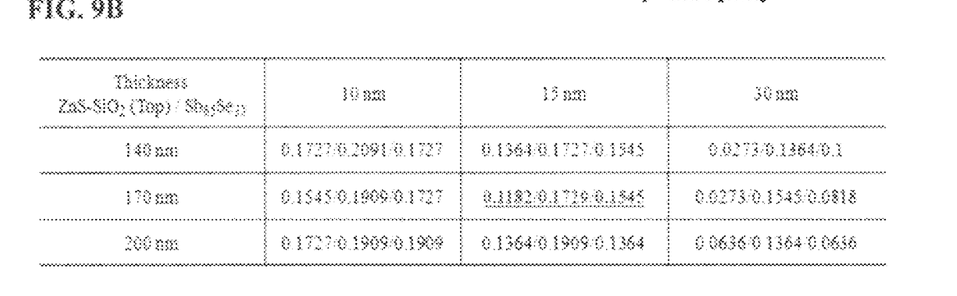

FIGS. 9A and 9B are views showing the simulation results of the sizes of the dynamic optical nano apertures on the dynamic nano aperture layer in accordance with the variations of the thicknesses of the dynamic nano aperture layer and the first dielectric layer of the dynamic optical head layer. FIG. 9A shows the formation of the dynamic optical nano aperture and FIG. 9B shows the sizes of the dynamic optical nano aperture.

The changes in optical properties on the dynamic nano aperture layer 120 are made at a temperature of Tg or more, and thus, the nano apertures are formed. In this case, the sizes of the nano apertures are different in accordance with the thicknesses of the dynamic optical head layer 100.

The printing of the photoresist 220 deposited on the substrate 210 is conducted under the influence of the near-field of light and the increment of the transmittance of the dynamic nano aperture layer 120.

Figure 10:
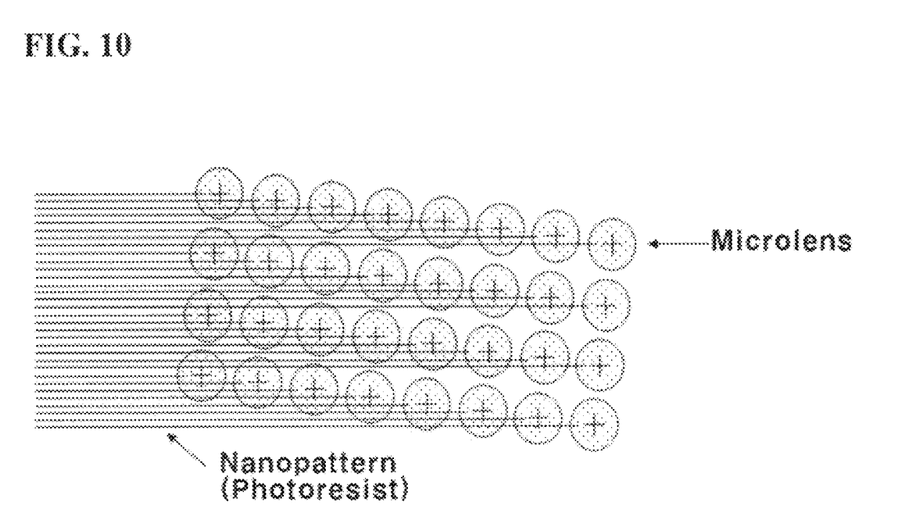
FIG. 10 is a view showing the formation of patterns through a microlens array.

FIG. 10 is a view showing the formation of patterns through a microlens array. As shown in FIG. 10, nanopatterns can be obtained simultaneously through the microlens array.

As described above, the dynamic optical head layer and the lithography method using the same according to the present invention adopt the principle wherein a soft nano thin film optical structure is located on a relatively high depth of focus area produced by a far-field optical system (microlens array) to cause the optical properties of the nano thin film to be changed to reveal a near-field, thus solving the fundamental limit in large area patterning suffered in the existing near-field system, that is, solving the problems that the near-field is not revealed due to the deviation from a focused surface and it is hard to conduct the patterning on the flexible substrate.

Additionally, the dynamic optical head layer and the lithography method using the same according to the present invention apply the substrate layer made of the soft elastic material to a lithography system, so that it is possible to make nano-scale patterns on the various shaped substrates, e.g., a curved substrate, thus controlling the gaps formed in the existing patterning way using the near-field to allow arbitrary nanopatterns having high degree of precision to be manufactured in large area.

Further, the dynamic optical head layer and the lithography method using the same according to the present invention are configured wherein the soft dynamic optical head layer is detachably mounted on the existing maskless printing equipment, thus conducting the formation of the nanopatterns, without having any change in system or any manufacturing of new system. Furthermore, the dynamic optical head layer can be reused through annealing after the formation of the nanopatterns, thus being easily applicable to industrial fields.

Moreover, the dynamic optical head layer and the lithography method using the same according to the present invention are configured wherein the dynamic nano aperture layer is made of a material having optical anisotropy, desirably, $Sb_{65}Se_{35}$ to allow an optical nano aperture formation temperature to be lowered, thus making it possible to conduct large area patterning using the microlens array with low energy light source and reducing light/heat spreading through rapid response speed to achieve the formation of nanopatterns. That is, the $Sb_{65}Se_{35}$ having optical anisotropy has a low value of 538° C., so that the optical nano apertures of the dynamic optical head layer can be formed through the low energy light source caused by low melting point.

In addition, the dynamic optical head layer and the lithography method using the same according to the present invention are configured wherein scanning type patterning in the unit of mm/s is conducted, thus making it possible to conduct large area patterning in the scanning way using X and Y stages and being applicable to the fields in which various electronic components like displays, semiconductors and so on are manufactured.

Further, the dynamic optical head layer and the lithography method using the same according to the Present invention are configured wherein the substrate layer is made of a soft elastic material, so that the dynamic optical head layer can be easily deposited on various shaped substrates, e.g., a curved substrate.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A dynamic optical head layer in an optical lithography system forming patterns on a substrate, the dynamic optical head layer being detachably mounted on the substrate, the dynamic optical head layer comprising:
    a first dielectric layer formed on a top portion thereof;
    a second dielectric layer formed on a bottom portion thereof; and
    an dynamic nano aperture layer formed between the first dielectric layer and the second dielectric layer,
    wherein the dynamic nano aperture layer is made of a material having optical anisotropy, and the first dielectric layer and the second dielectric layer are made of oxide-based materials, nitride-based materials, and carbide-based materials, and
    wherein the material having optical anisotropy is $Sb_{65}Se_{35}$.

2. The dynamic optical head layer according to claim 1, wherein the oxide-based materials comprise $SiO_2$, ZnS—$SiO_2$, $GeO_2$, $BeO_2$, $ZrO_2$, $BaTiO_3$, $SrTiO_3$, and TaO.

3. The dynamic optical head layer according to claim 1, wherein the nitride-based materials comprise $SiN_4$, BN, and AlN.

4. The dynamic optical head layer according to claim 1, wherein the carbide-based materials comprise SiC.

5. The dynamic optical head layer according to claim 1, further comprising a substrate layer located on the top of the first dielectric layer to support the laminated structure of the first dielectric layer, the dynamic nano aperture layer, and the second dielectric layer.

6. The dynamic optical head layer according to claim 5, wherein if the deposited surface of the substrate layer is curved, the substrate layer is made of a soft elastic material, and if the deposited surface thereof is flat, the substrate layer is made of a material like hard glass.

7. The dynamic optical head layer according to claim 6, wherein the substrate layer comprises any one of films, such as PC, COP, PI, PET, OPP, PE, PP, PMMA, and acrylic films, and glass, such as sodalime glass, borosilicate glass, fused silica glass, and quartz glass.

8. The dynamic optical head layer according to claim 1, further comprising a hydrophobic coating layer coated on the underside surface of the second dielectric layer to allow the second dielectric layer to be easily detached from a photoresist.

9. The dynamic optical head layer according to claim 8, wherein the hydrophobic coating layer is formed by using a self-assembled oligomer of PDMS or by depositing a self-assembled monolayer.

10. The dynamic optical head layer according to claim 9, wherein the self-assembled monolayer comprises a slime or thiol-based self-assembled monolayer.

11. A lithography method using a dynamic optical head layer, comprising:
    the substrate preparation step of placing a substrate on a stage;
    the photoresist coating step of coating a photoresist onto the substrate;
    the dynamic optical head layer coupling step of coupling the dynamic optical head layer to the photoresist;
    the pattern formation step of irradiating laser beams, moving the stage, and forming patterns on the substrate; and
    the super resolution separation step of separating the dynamic optical head layer from the photoresist,
    wherein the dynamic optical head layer comprises a first dielectric layer formed on a top portion thereof, a second dielectric layer formed on a bottom portion thereof, and an dynamic nano aperture layer formed between the first dielectric layer and the second dielectric layer, the dynamic nano aperture layer being made of a material having optical anisotropy, and the first dielectric layer and the second dielectric layer being made of oxide-based materials, nitride-based materials, and carbide-based materials, and if the laser beams are irradiated in the pattern formation step, dynamic optical nano apertures are formed on the dynamic nano aperture layer to allow the laser beams to be transmitted therethrough to form patterns on the substrate, and
    wherein the material having optical anisotropy is $Sb_5Se_{35}$.

12. The lithography method according to claim 11, wherein in the pattern formation step the patterns are formed in such a way that the laser beams are incident through modulation and the incident laser beams are focused through a microlens array and or in such a maskless way using a DMD (digital micro mirror device).

13. A lithography system using a dynamic optical head layer, comprising:
    a pattern part having a substrate on which patterns are formed;
    the dynamic optical head layer detachably mounted on the substrate; and
    a microlens array adapted to allow laser beams incident to the dynamic optical head layer and the pattern part to be focused,
    wherein the dynamic optical head layer comprises a first dielectric layer formed on a top portion thereof, a second dielectric layer formed on a bottom portion thereof, and an dynamic nano aperture layer formed between the first dielectric layer and the second dielectric layer, the dynamic nano aperture layer being made of a material having optical anisotropy, the first dielectric layer and the second dielectric layer being made of oxide-based materials, nitride-based materials, and carbide-based materials, and the material having optical anisotropy being $Sb_{65}Se_{35}$.

* * * * *